(12) United States Patent
Sato et al.

(10) Patent No.: US 8,525,338 B2
(45) Date of Patent: Sep. 3, 2013

(54) CHIP WITH SINTERED CONNECTIONS TO PACKAGE

(75) Inventors: Hiroaki Sato, Yokohama (JP); Kiyoaki Hashimoto, Yokohama (JP); Yoshikuni Nakadaira, Hodogaya-Ku (JP); Norihito Masuda, Yokohama (JP); Belgacem Haba, Saratoga, CA (US); Ilyas Mohammed, Santa Clara, CA (US); Philip Damberg, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 47 days.

(21) Appl. No.: 13/154,778

(22) Filed: Jun. 7, 2011

(65) Prior Publication Data
US 2012/0313264 A1 Dec. 13, 2012

(51) Int. Cl.
*H01L 23/48* (2006.01)
*H01L 23/52* (2006.01)
*H01L 29/40* (2006.01)
*H01L 21/00* (2006.01)

(52) U.S. Cl.
USPC ............. 257/746; 257/773; 257/E23.018; 438/106

(58) Field of Classification Search
USPC .......... 257/786, E21.504, E23.039, E23.055, 257/784, 520, 698, 746, 773, E23.018, E23.166, 257/E23.025, E23.04, E23.133, E23.109; 438/123
See application file for complete search history.

(56) References Cited

U.S. PATENT DOCUMENTS

| | | | |
|---|---|---|---|
| 4,671,849 A | 6/1987 | Chen et al. | |
| 5,070,297 A | 12/1991 | Kwon et al. | |
| 5,148,265 A | 9/1992 | Khandros et al. | |
| 5,148,266 A | 9/1992 | Khandros et al. | |
| 5,679,977 A | 10/1997 | Khandros et al. | |
| 5,739,585 A * | 4/1998 | Akram et al. | 257/698 |
| 5,948,533 A | 9/1999 | Gallagher et al. | |
| 6,765,287 B1 | 7/2004 | Lin | |
| 7,759,166 B2 | 7/2010 | Haba et al. | |
| 2002/0185751 A1* | 12/2002 | Choi et al. | 257/786 |
| 2006/0221573 A1* | 10/2006 | Li | 361/704 |
| 2011/0304041 A1* | 12/2011 | Chung | 257/737 |

* cited by examiner

*Primary Examiner* — Daniel Luke
*Assistant Examiner* — Khaja Ahmad
(74) *Attorney, Agent, or Firm* — Lerner, David, Littenberg, Krumholz & Mentlik, LLP

(57) ABSTRACT

A microelectronic package and method of making same are provided. The package includes a substrate having first and second opposed surfaces, an edge surface extending therebetween, a plurality of terminals, and a plurality of conductive elements electrically connected with the terminals. The edge surface can be disposed at a periphery of the substrate or can be the edge surface of an aperture within the substrate. A microelectronic element has a front face and contacts thereon, with at least some of the contacts being adjacent to the edge surface of the substrate. A dielectric material overlies the edge surface of the substrate and defines a sloping surface between the front face of the microelectronic element and the substrate. A conductive matrix material defines a plurality of conductive interconnects extending along the sloping surface. The conductive interconnects electrically interconnect respective ones of the contacts with the conductive elements.

22 Claims, 8 Drawing Sheets

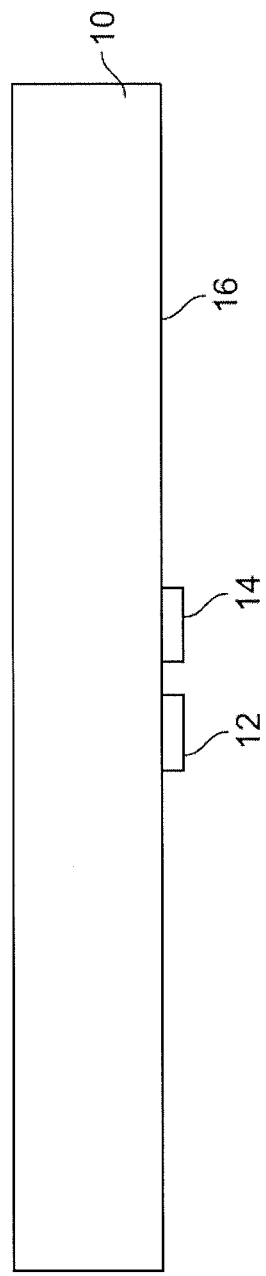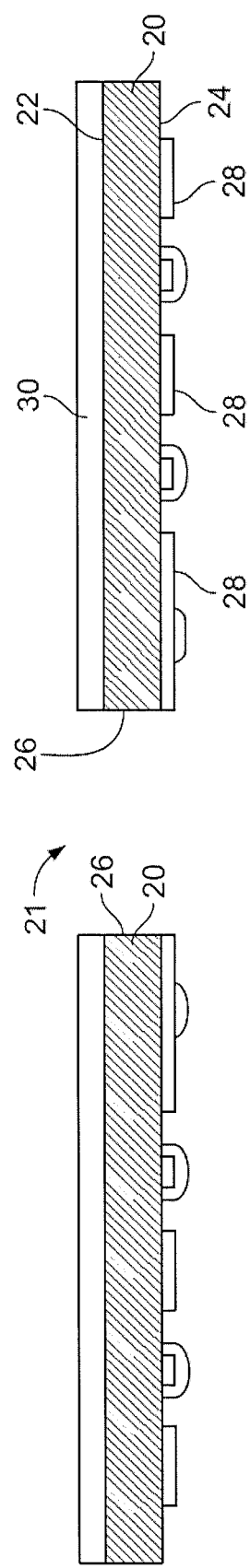

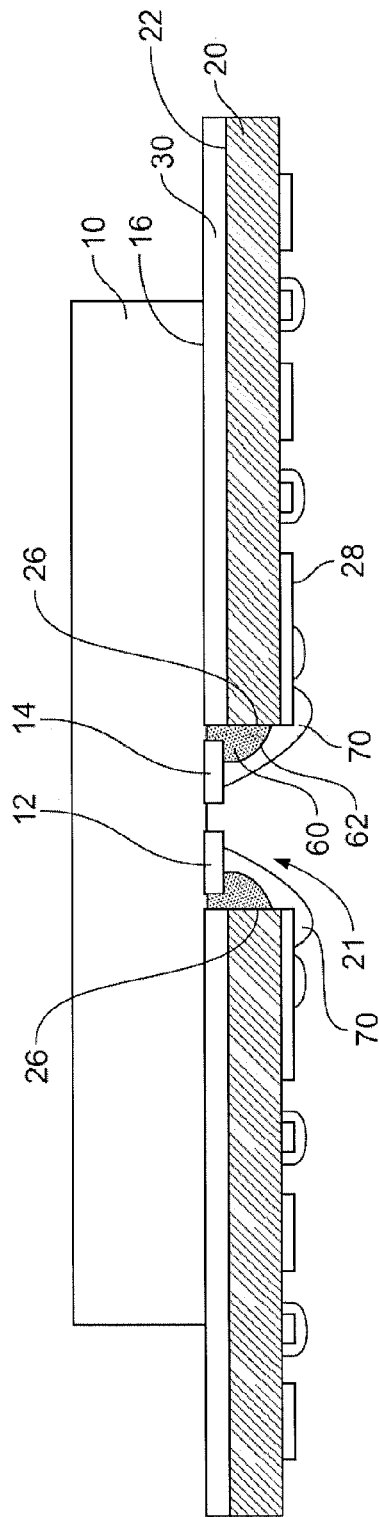
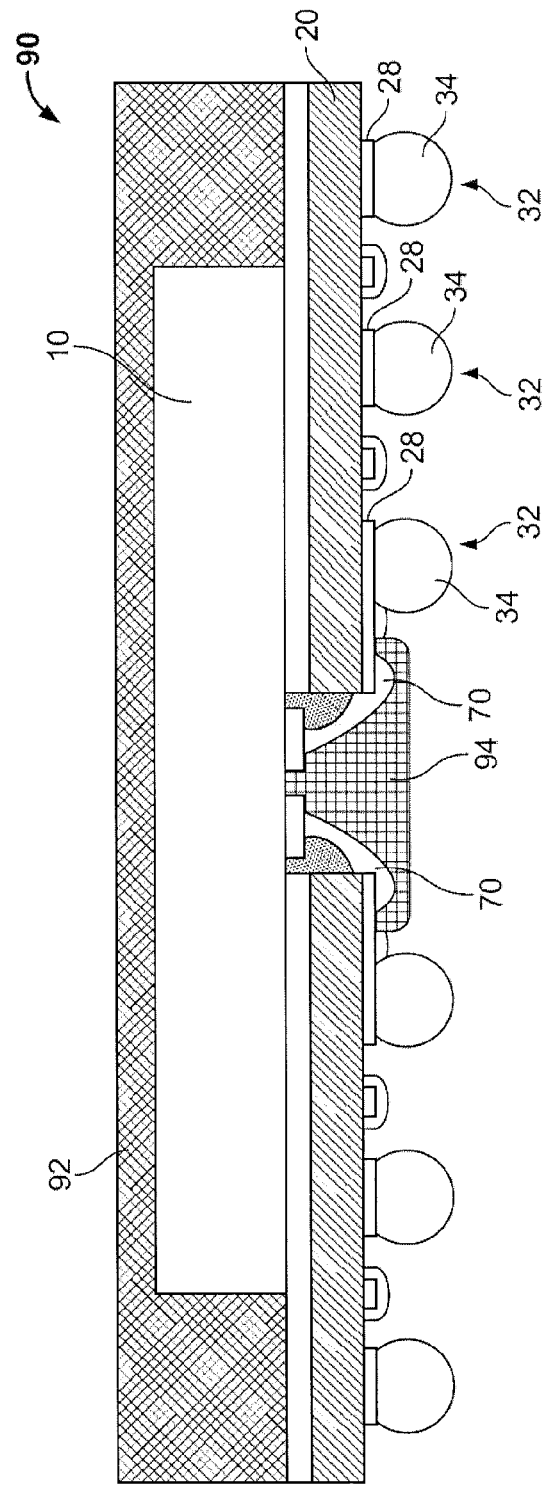

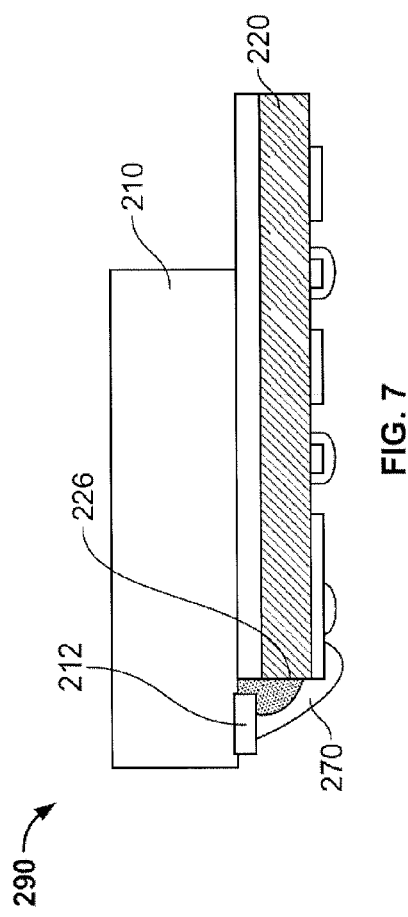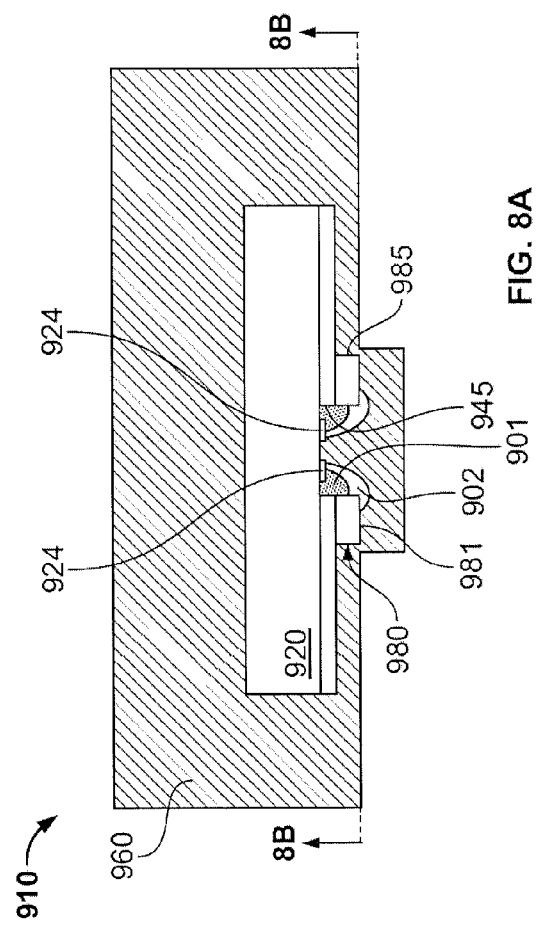

CHIP WITH SINTERED CONNECTIONS TO PACKAGE

BACKGROUND OF THE INVENTION

The present invention relates to microelectronic packages or assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the entire disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

BRIEF SUMMARY OF THE INVENTION

According to a first aspect of the present invention, a microelectronic package can include a substrate having first and second opposed surfaces and an edge surface extending therebetween. The substrate can have a plurality of terminals and a plurality of conductive elements electrically connected with the terminals. The microelectronic package includes a microelectronic element having a front face and contacts thereon. At least some of the contacts can be adjacent to the edge surface of the substrate. A dielectric material can overlie the edge surface of the substrate and define a sloping surface between the front face of the microelectronic element and the substrate, the dielectric material being other than an adhesive layer between the microelectronic element and the substrate. A conductive matrix material can define a plurality of conductive interconnects extending along the sloping surface, the conductive interconnects electrically interconnecting respective ones of the contacts with the conductive elements.

In accordance with certain embodiments of this first aspect, the microelectronic package may further include an adhesive layer bonding the first surface of the substrate with the front face of the microelectronic element. The edge surface may be disposed at a periphery of the substrate. Alternatively or in addition thereto, the substrate may include an aperture extending between the first and second opposed surfaces, and the edge surface may be an edge surface of the aperture. In one example, the substrate may include a dielectric element, and the conductive elements may extend along a surface thereof. The conductive elements may extend along a surface of the dielectric element facing away from the microelectronic element.

In a particular example, the substrate may be a lead frame, and the conductive elements may be fingers of the lead frame.

In another example, the substrate may include an element having a coefficient of thermal expansion of less than parts per million per degree Celsius. The conductive elements may extend along a surface of the substrate facing away from the microelectronic element. The sloping surface may extend between the front face of the microelectronic element and the edge surface of the substrate. In one example, at least a portion of the edge surface may not be covered by the dielectric material. The dielectric material may cover the entire edge surface of the substrate. The dielectric material may cover at least a portion of the second surface of the substrate.

A system of the present invention may include a structure according to the foregoing and one or more other electronic components electrically connected to the structure. The system may further include a housing, the structure and the other electronic components being mounted to the housing.

According to a second aspect of the present invention, a method of making a microelectronic package can include providing a substrate having first and second opposed surfaces and an edge surface extending therebetween, the substrate having a plurality of terminals and a plurality of conductive elements electrically connected with the terminals, and mounting a microelectronic element to the substrate, the microelectronic element having a front face and contacts thereon. The microelectronic element can be mounted such that at least some of the contacts of the microelectronic element are adjacent to the edge surface of the substrate. A dielectric material can overlie the edge surface of the substrate and may define a sloping surface between the front face of the microelectronic element and the substrate, the dielectric material being other than an adhesive layer between the microelectronic element and the substrate. A conductive matrix material can define a plurality of conductive interconnects extending along the sloping surface, the conductive interconnects electrically interconnecting the contacts with respective conductive elements.

In accordance with certain embodiments of this second aspect, the step of depositing a conductive matrix material may include dispensing the conductive matrix material directly onto the microelectronic package. The step of depositing a conductive matrix material may include stenciling the conductive matrix material directly onto the microelectronic package. The step of depositing a conductive matrix material may include transfer printing the conductive matrix material directly onto the microelectronic package. The step of depositing a dielectric material may include covering the entire edge surface of the substrate. The step of depositing a dielectric material may include covering at least a portion of the second surface of the substrate.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

BRIEF DESCRIPTION OF THE DRAWINGS

FIG. 1 is a sectional view of a microelectronic element in accordance with a first embodiment of the present invention.

FIG. 2 is a sectional view of a substrate in accordance with the first embodiment of the present invention.

FIGS. 3 and 4 are sectional views of a microelectronic package assembled from the microelectronic element of FIG. 1 and the substrate of FIG. 2 in accordance with the first embodiment of the present invention.

FIG. 7 is a sectional view of a microelectronic package in accordance with another embodiment of the present invention.

FIG. 8A is a diagrammatic sectional view of a stacked microelectronic assembly according to another embodiment having a lead frame.

DETAILED DESCRIPTION

Figure 4B:
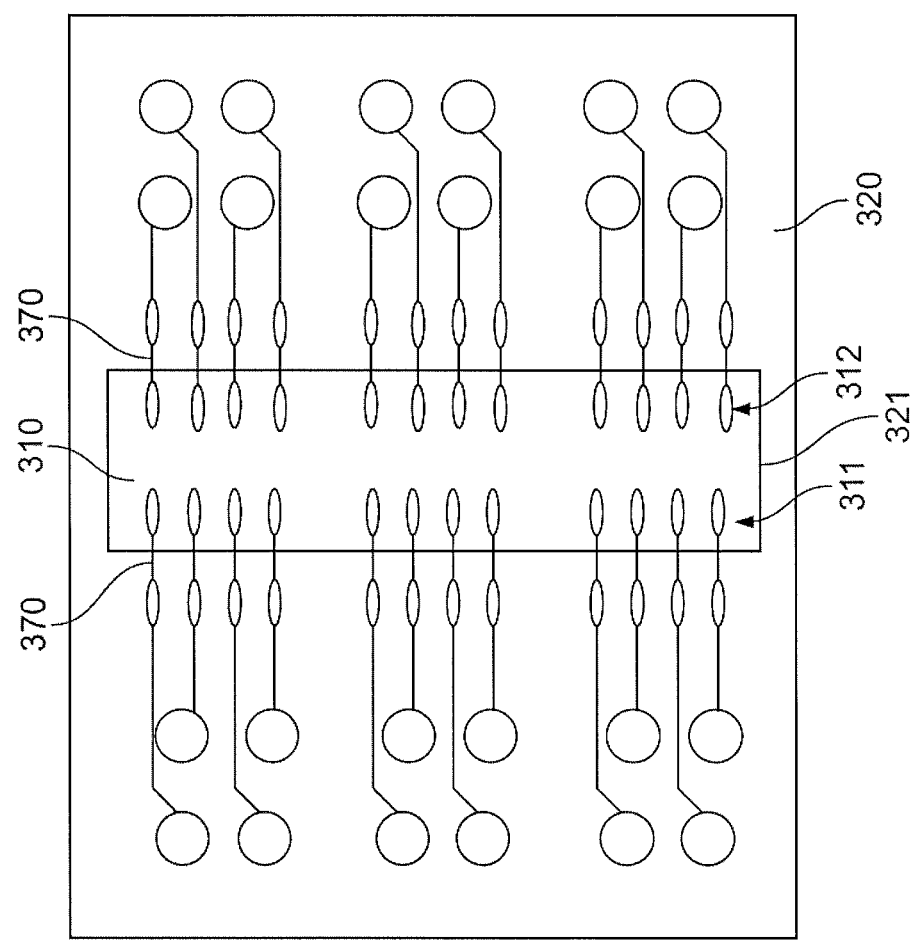
FIG. 4B is a diagrammatic bottom view of a stacked microelectronic assembly according to another embodiment of the present invention.

A microelectronic package 90, shown in FIG. 4, will be herein described in the context of its method of construction. FIG. 1 shows a microelectronic element 10 having a front face 16 and contacts 12 and 14 disposed on front face 16. In some embodiments, the microelectronic element 10 can be a semiconductor chip, or an element including a semiconductor chip, which has contacts at face 16. The semiconductor chip includes a thin slab of a semiconductor material, such as silicon or gallium arsenide, typically having active semiconductor devices therein. The microelectronic element 10 may be a semiconductor chip such as a memory chip, e.g., dynamic random access memory ("DRAM") chip or having other type of memory. Alternatively, the semiconductor chip may be configured predominantly to perform some other function, which may be a logic function, such as of a microprocessor, application-specific integrated circuit ("ASIC"), field programmable gate array ("FPGA") or other logic chip, among others. Microelectronic element 10 as shown in FIG. 1 is typically is a DRAM chip 310 having one or two rows 311, 312 of contacts on a front face thereof, which may be disposed in a central region of the front surface, as shown in FIG. 4B.

A substrate 20 is depicted in FIG. 2, and includes a bond window or aperture 21. A similar aperture 321 can be seen in substrate 320 of FIG. 4B. Substrate 20 has a first surface 22 and a second surface 24 opposed from the first surface 22. An edge surface 26 extends between surfaces 22 and 24. Substrate 20 includes a plurality of conductive elements 28. In the embodiment shown in FIG. 2, conductive elements 28 extend along second surface 24 which faces away from microelectronic element 10. An adhesive 30 may be disposed on first surface 22.

In particular embodiments, the substrate can be a dielectric element of various types of construction, such as of polymeric material or inorganic material such as ceramic or glass, the substrate having conductive elements thereon such as terminals and conductive elements such as, e.g., traces, substrate contacts, or other conductive elements electrically connected with the terminals. In particular examples, such dielectric element can be a polymeric tape, or can include bismaleimide-triazine (BT) resin, or have a composite structure of epoxy-glass such as FR-4. In another example, the substrate can consist essentially of a semiconductor material such as silicon, or alternatively include a layer of semiconductor material and one or more dielectric layers thereon. In one example, the substrate may include semiconductor, glass, ceramic material or a combination thereof and have a coefficient of thermal expansion of less than 8 parts per million/° C. ("ppm/° C.").

Contacts 12, 14 of microelectronic element 10 can include bond pads or other conductive structure such as bumps, posts, etc. Bond pads may include one or more metals such as copper, nickel, gold or aluminum, and may be about 0.5 µm thick. The size of the bond pads can vary with the device type. The exposed bonding faces of the bond pads typically have widths across the bonding face of tens to hundreds of microns.

Microelectronic element 10 can be mounted to substrate 20, as shown in FIG. 3. Adhesive 30 connects first surface 22 of substrate 20 to front face 16 of microelectronic element 10. As contacts 12 and 14 are to be connected with terminals on second surface 24 of substrate 20, contacts 12 and 14 are positioned such that they are adjacent to edge surfaces 26 that define aperture 21. With element 10 mounted to substrate 20, a dielectric material 60 is deposited to overlie the edge surface 26 and to define a sloping surface 62 between front face 16 of microelectronic element 10 and substrate 20 to reduce the angle between same. Dielectric material 60 can be deposited in bead form such that at least portions of each of contacts 12 and 14 remain exposed after the dielectric material is deposited. In one embodiment, the dielectric material can be deposited by a dispensing process in which a tip of a fluid-filled tube moving along the edge surface directs uncured dielectric material towards the a boundary between the edge surface 26 and the front face 16 of the microelectronic element 10. The dielectric material can then undergo subsequent curing. In another example, the bead of dielectric material can be formed by stenciling.

In certain embodiments, sloping surface 62 can extend between front face 16 of microelectronic element 10 and edge surface 26 of substrate 20. At least a portion of edge surface 26 may not be covered by dielectric material 60. As shown in FIGS. 3 and 4, a conductive matrix material is deposited to overlie the bead of dielectric material 60 to define a plurality of conductive interconnects extending along the sloping surface 62. The conductive interconnects 70 electrically connect contacts 12, 14 with the conductive elements 28 disposed on second surface 24 of substrate 20. Similar conductive interconnects 370 are seen in FIG. 4B providing electrical connection between microelectronic element 310 and substrate 320.

As deposited, i.e., before sintering, the conductive matrix material can include particles or flakes of a high melting-point material such as copper or silver, and particles or flakes a low melting-point material, such as tin, bismuth, or a combination of tin and bismuth. Some particles may have a structure which includes metal or non-metal cores, for example, polymer, silica or graphite cores, and a different metal such as a low melting-point metal thereon.

In some examples, the conductive matrix material may include a "reactive" or uncured polymer. After deposition, the structure is subsequently heated to a temperature for sintering the conductive matrix material. During this sintering process, the high and low melting point metals fuse together, typically forming intermetallics therebetween, and forming a solid matrix of metal which can have an open cell foam-like appearance. The deposited conductive matrix material may include a medium which escapes from the metallic component thereof during the sintering process, such as by evaporation, such that the conductive matrix material may have voids therein. Alternatively, the conductive matrix material may include a reactive polymer component. Typically, the polymer component cross-links and cures as a result of the sintering process. The polymer component can become interspersed throughout the metal matrix as a result of the sintering process, the polymer material typically being connected together in open cells of the metal matrix. The metal matrix and polymer interspersed throughout may then form a solid conductive structure.

Under certain conditions, after sintering, the conductive matrix material forms a solid structure which subsequently cannot be reflowed except at a temperature substantially higher than the temperature at which the sintering process is performed. Such result may be obtained by sintering particularly when a low melting-point metal, e.g., tin or bismuth, is substantially consumed in the formation of intermetallics with at least one other metal component, of the conductive material, e.g., copper.

Depending upon the application, the temperature at which the conductive matrix material is sintered can be substantially lower than a reflow temperature at which alternative connections made of solder would need to be formed. Metals, e.g., copper, silver added to solder to improve mechanical resilience can increase the melting-temperature of the solder. Thus, the structure described herein may provide a more mechanically robust system with a lower joining temperature than corresponding solder connections.

In such case, use of such conductive matrix material can help to avoid problems associated with higher temperature joining processes. For example, lower temperature joining processes achieved using a conductive matrix material can help avoid undesirable changes in substrates which include organic materials whose glass transition temperatures are relatively low. Also, lower temperature joining processes may help to address concerns during such joining processes relating to differential thermal expansion of the substrate relative to the microelectronic element. In this case, a lower temperature joining process can lead to improved package reliability since reduced thermal excursion during the joining process can lead to less stresses being locked into the assembled microelectronic package.

In a particular example, the conductive matrix material may include a fluxing component as deposited. The fluxing component can assist in removing oxidation byproducts during the sintering process.

In one embodiment, the joining process can be conducted using a conductive matrix material that does not have a fluxing component. In such case, the joining process may be performed in a low pressure, e.g., partial vacuum, environment, or one in which oxygen has been evacuated or replaced with another gas.

Use of a conductive matrix material to electrically connect the substrate 20 with the microelectronic element 10 may help achieve particular results. The conductive matrix material can be applied without applying high forces to the contacts and conductive elements which are common in wire-bonding and lead-bonding operations.

The deposition of the conductive matrix material in viscous phase and the subsequent fusing of the material to the contacts and conductive elements during fabrication can result in the conductive interconnects having greater surface area in contact with the contacts and conductive elements than is common with wire bonds and lead bonds. As a result of the sintering process, the conductive matrix material can wet the contacts, and surface tension between the conductive matrix material and the contacts can cause the material to spread over a greater surface area of the contacts, or to spread over entire surface areas of the contacts. This contrasts with direct wire-bonding and lead-bonding operations wherein the bonded wires or leads typically do not contact entire surface areas of contacts, e.g., bond pads. These characteristics of the conductive matrix material may help to reduce the incidence of defects in the conductive connections within assemblies or packages.

The conductive matrix material can be applied in many different ways. A transfer printing process involves providing a mandrel having grooves that correspond to the positions of the interconnects 70 to be formed. The grooves can be filled with the conductive matrix material and a transfer tool, such as compliant pad, is applied to the mandrel such that the conductive matrix material shifts onto the surface of the transfer tool. The transfer tool is then applied to the substrate such that the matrix material is deposited at the appropriate locations to form the interconnects 70. This process of transfer printing can be likened to ironing a completed decal onto a cotton surface, such as a t-shirt. An inkjet process of spraying atomized material, including silver or copper nanoparticles, can be used to form the interconnects 70. Other methods of forming conductive interconnects 70 can include dispensing, stenciling, or laser printing, among others.

Alternatively, a lithography or laser process can be used to form grooves in a dielectric layer of material, and the conductive matrix material can then be stenciled or dispensed into the grooves to form an embedded structure. In another alternative, photolithography can be used to form grooves in a photoresist layer, and the conductive matrix material can then be dispensed or stenciled into the grooves. In a particular example, either method can be done in an evacuated chamber to prevent trapping of air within the grooves during the dispensing or stenciling process. Forming the conductive interconnects in an evacuated chamber can be of particular benefit when the conductive interconnects to be formed are very small After the dielectric beads 60 and conductive interconnects 70 are formed, an optional encapsulant 92 can be added to the package. In one example, an overmold can be formed which covers peripheral edge surfaces and the rear surface of microelectronic element 10, as shown in FIG. 4. An encapsulant 94 may be formed to cover the interconnects 70 and exposed portions of contacts 12 and 14 and front face 16 of microelectronic element 10, such as by dispensing or other method. A plurality of terminals 32 electrically connected with conductive elements 28 of substrate 20 can include conductive pads, posts, or other conductive structure, such that the terminals are electrically connected with the contacts 12 and 14 through the conductive elements and the interconnects 70. The package may or may not include solder balls 34, or other bond metal or bonding material joined to the terminals.

Figure 5:
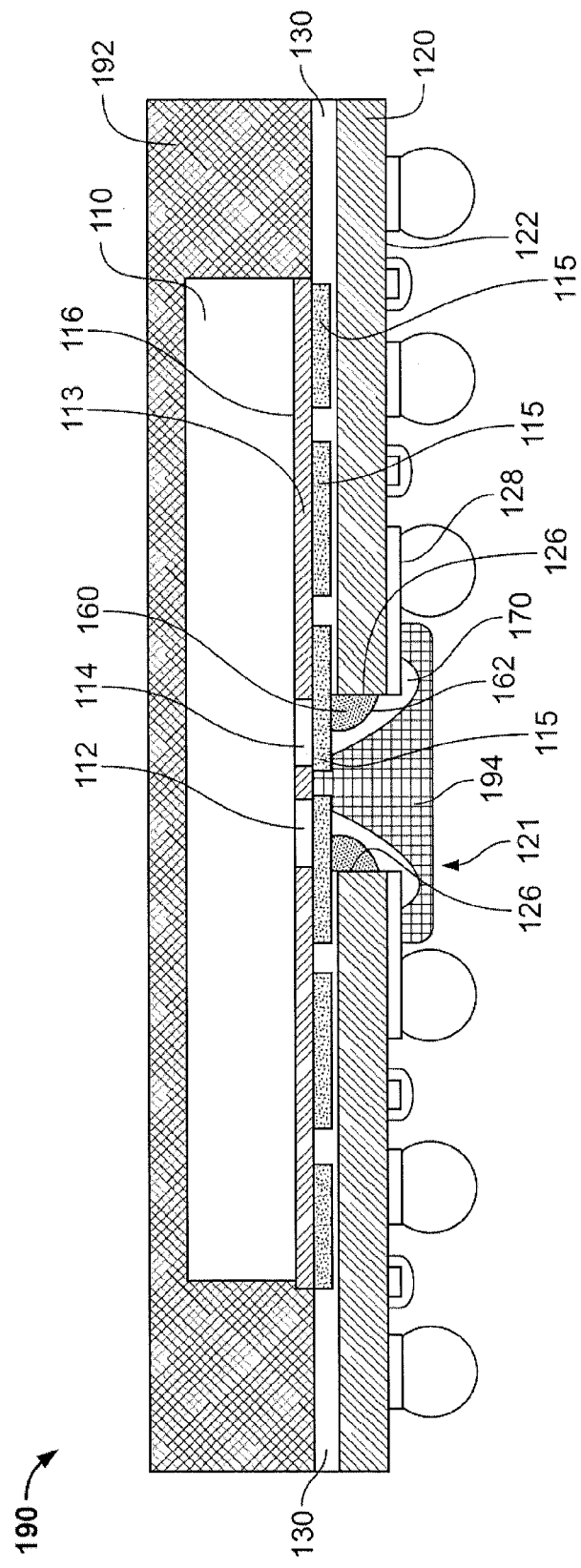
FIG. 5 is a sectional view of a microelectronic package in accordance with a second embodiment of the present invention.

A second embodiment of the present invention is a microelectronic package 190, shown in FIG. 5, and is similar in nature to the above-described package 90, with like numerals describing like elements. A microelectronic element 110 includes redistribution contacts 115 that overlie contacts 112 and 114 and dielectric layer 113 and are aligned with aperture 121. The redistribution contacts may be connected with contacts of the chip which are covered by the substrate. A substrate 120 is connected to dielectric layer 113 and redistribution contacts 115 via an adhesive 130.

Figure 6:
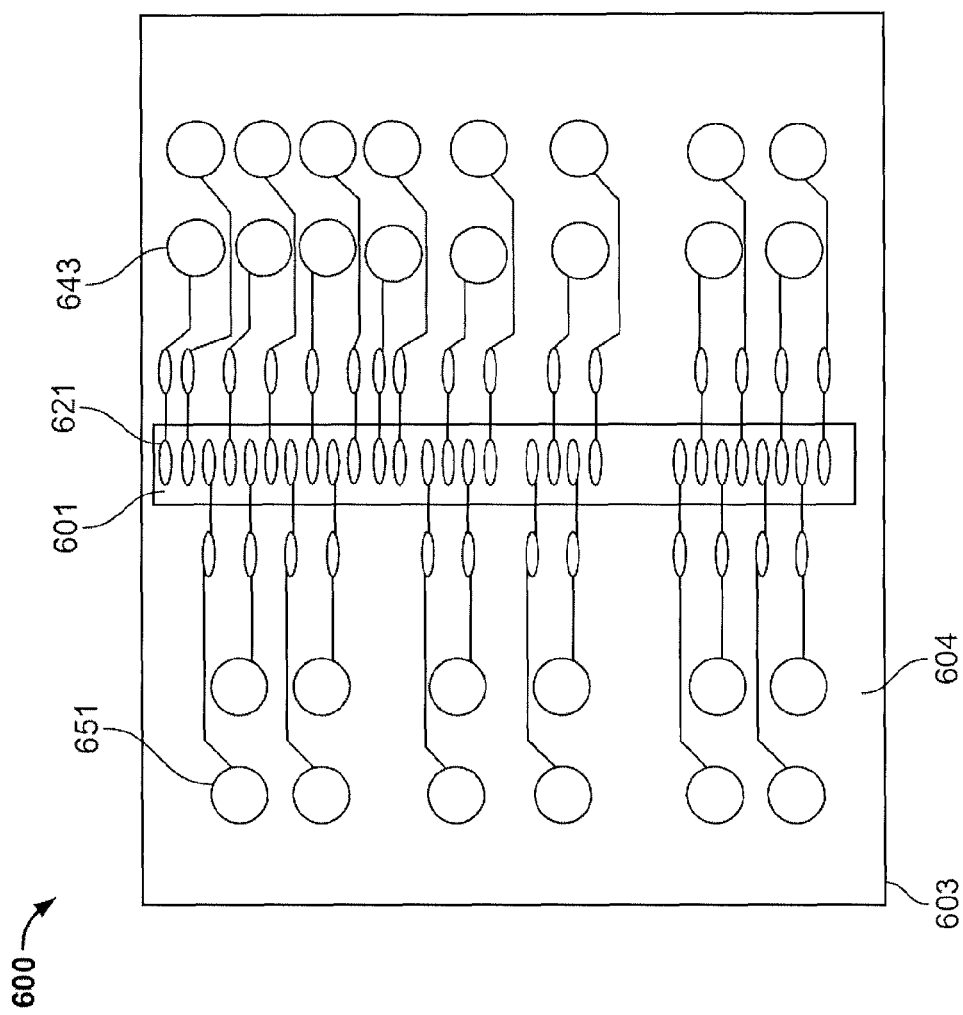
FIG. 6 is a diagrammatic bottom view of a stacked microelectronic assembly according to another embodiment of the present invention.

As noted above, the embodiment shown in FIGS. 1-4 can include substrate 20 having a bond window or aperture 21. Accordingly, the edge surfaces of substrate 20 can be internal to the substrate, such as an edge surface of the bond window or aperture extending between first and second surfaces 22 and 24. This type of construction is depicted in FIGS. 4B and 6, which show microelectronic assemblies having two rows of contacts and a single row of contacts, respectively.

In another embodiment shown in FIG. 7, a microelectronic package 290 is formed of a microelectronic element 210 mounted to a substrate 220. Package 290 is similar to the above-described embodiments, with like numerals describing like elements, but includes an edge surface 226 of substrate 220 that forms an outermost periphery thereof. A contact 212 of microelectronic element 210 is positioned adjacent to peripheral edge surface 226 when package 290 is assembled. The contacts of the microelectronic element can be disposed adjacent to a peripheral edge of the microelectronic element. Although not shown, an encapsulant can be dispensed to cover all or a portion of interconnects 270 and/or microelectronic element 210.

Figure 8B:
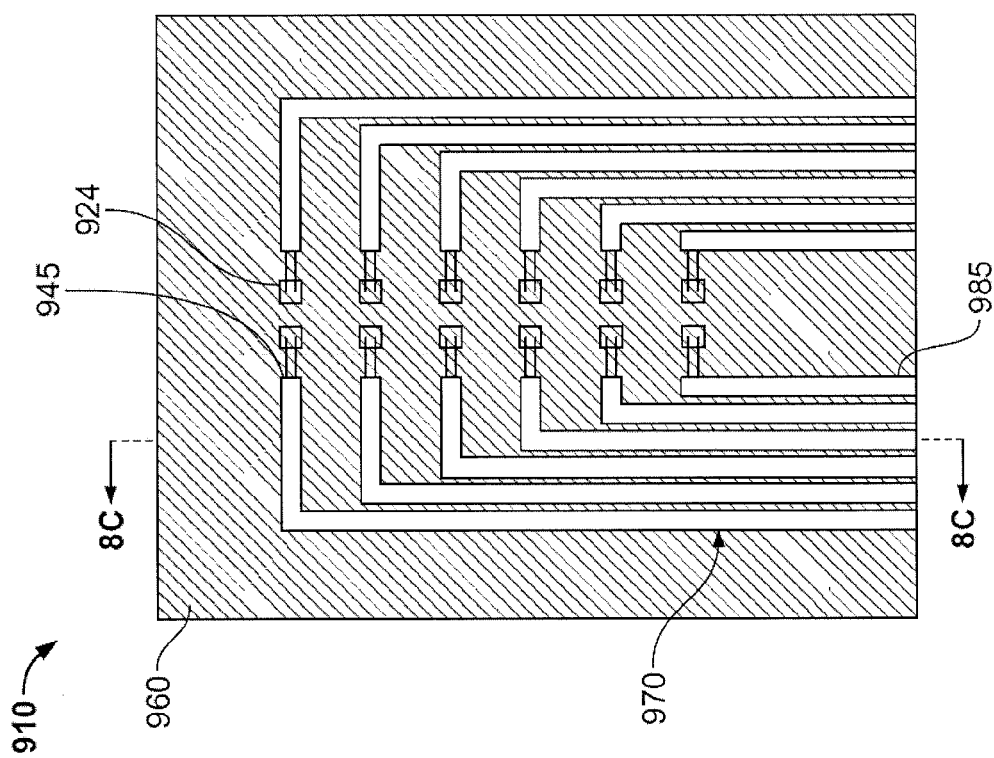
FIG. 8B is a bottom sectional view of the stacked assembly of FIG. 8A, taken along the line 8B-8B of FIG. 8A.
Figure 8C:
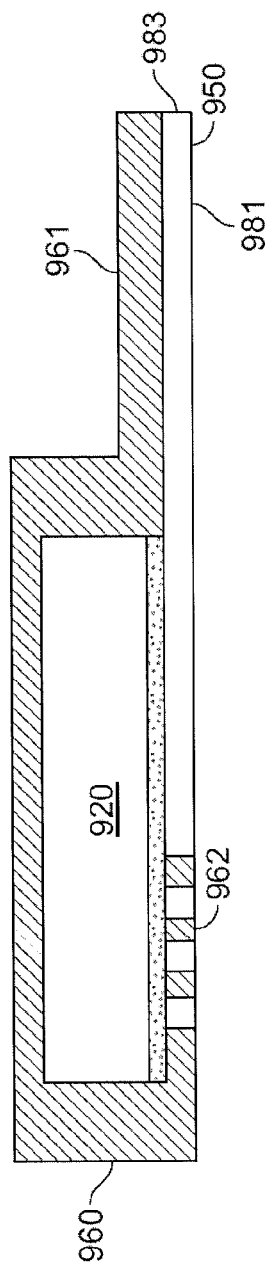
FIG. 8C is a side sectional view of the stacked assembly of FIG. 8B, taken along the line 8C-8C of FIG. 8B.

A microelectronic package according to another embodiment of the present invention showing the use of a lead frame 980 is depicted in FIGS. 8A-8C. Conductive elements of a lead frame 980, e.g., lead fingers 970, can electrically connect with contacts 924 of a microelectronic element 920 through conductive interconnects 902 of a conductive matrix material. The lead fingers 970 may include conductive trace portions 985 of the lead frame 980. In a particular example, the lead fingers 970 are usable to deliver power, ground, and signals to and from microelectronic elements 920.

In one example, lead frame 980 can define an edge surface 945 aligned with contacts 924, such that connections through conductive interconnects 902 as described above can extend between the chip contacts 924 and a surface 981 of lead frame 980. Dielectric material 901 can be deposited to overlie edge surface 945 and to define a sloping surface 62 between a front face of microelectronic element 920 and lead frame 980 to reduce the angle between same. Edge surface 945 can also include an adjacent surface of an adhesive. An encapsulant 960 can cover the microelectronic element 920 and a portion of the lead frame 980, wherein package contacts (not shown in the particular view of FIG. 8A). Portions of the lead fingers 970 in such package (FIG. 8A) can be exposed for electrical connection, e.g., solder connections, with an external component such as a circuit panel, e.g., a printed circuit board.

In a particular embodiment as seen in FIGS. 8B-8C, the package 910 can have a plurality of parallel exposed package contacts 950 adjacent an insertion edge surface 983 of surface 981 for mating with corresponding contacts of a socket when the package 910 is inserted in the socket. Some or all of package contacts 950 can be exposed at surface 981 of lead frame 980. In one example, the package contacts 950 can be portions of the lead fingers 970 exposed at a lower surface of the package in an insertion portion 961 of the package. Encapsulant 960 can also cover contacts 924 and dielectric material 901 and the conductive matrix material forming conductive interconnects 902, in accordance with the above description. Insertion portion 961 can have an appropriate size and shape for mating with a corresponding socket (not shown) when the package 910 is inserted in the socket.

Figure 9:
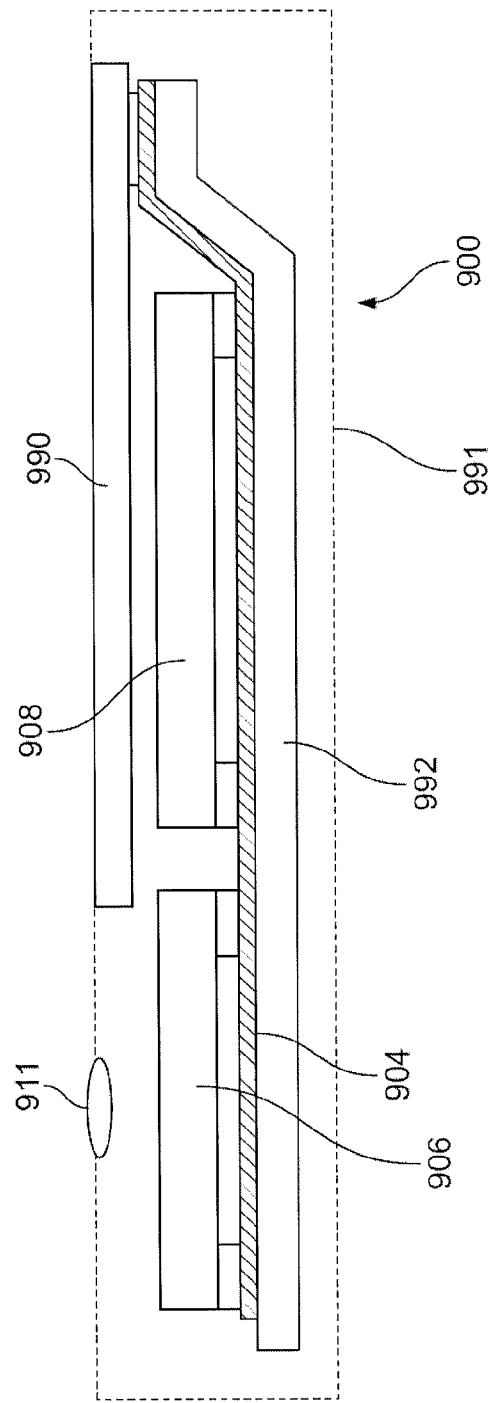
FIG. 9 is a schematic depiction of a system according to one embodiment of the invention.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 900 in accordance with a further embodiment of the invention includes a structure 906 as described above in conjunction with other electronic components 908 and 990. In the example depicted, component 908 is a semiconductor chip whereas component 990 is a display screen, but any other components can be used. Of course, although only two additional components are depicted in FIG. 9 for clarity of illustration, the system may include any number of such components. The structure 906 as described above may be, for example, a composite chip, or a structure incorporating plural chips. In a further variant, both may be provided, and any number of such structures may be used. Structure 906 and components 908 and 990 are mounted in a common housing 991, schematically depicted in broken lines, and are electrically interconnected with one another as necessary to form the desired circuit. In the exemplary system shown, the system includes a circuit panel 992 such as a flexible printed circuit board, and the circuit panel includes numerous conductors 904, of which only one is depicted in FIG. 9, interconnecting the components with one another. However, this is merely exemplary; any suitable structure for making electrical connections can be used. The housing 991 is depicted as a portable housing of the type usable, for example, in a cellular telephone or personal digital assistant, and screen 990 is exposed at the surface of the housing. Where structure 908 includes a light-sensitive element such as an imaging chip, a lens 911 or other optical device also may be provided for routing light to the structure. Again, the simplified system shown in FIG. 9 is merely exemplary; other systems, including systems commonly regarded as fixed structures, such as desktop computers, routers and the like can be made using the structures discussed above As these and other variations and combinations of the features discussed above can be utilized without departing from the present invention, the foregoing description of the preferred embodiments should be taken by way of illustration rather than by way of limitation of the invention as defined by the claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
    a substrate having first and second opposed surfaces and an edge surface extending therebetween, the substrate having a plurality of terminals and a plurality of conductive elements electrically connected with the terminals;
    a microelectronic element having a front face and contacts thereon, at least some of the contacts adjacent to the edge surface of the substrate;
    a dielectric material overlying the edge surface of the substrate and defining a sloping surface between the front face of the microelectronic element and the substrate, the dielectric material being other than an adhesive layer between the microelectronic element and the substrate; and
    a conductive matrix material defining a plurality of conductive interconnects extending along the sloping surface, the conductive interconnects electrically interconnecting respective ones of the contacts with the conductive elements.

2. The microelectronic package of claim 1, further comprising an adhesive layer bonding the first surface of the substrate with the front face of the microelectronic element.

3. The microelectronic package of claim 1, wherein the edge surface is disposed at a periphery of the substrate.

4. The microelectronic package of claim 1, wherein the substrate includes an aperture extending between the first and second opposed surfaces, and wherein the edge surface is an edge surface of the aperture.

5. The microelectronic package of claim 1, wherein the substrate includes a dielectric element, and the conductive elements extend along a surface thereof.

6. The microelectronic package of claim 5, wherein the conductive elements extend along a surface of the dielectric element facing away from the microelectronic element.

7. The microelectronic package of claim 1, wherein the substrate is a lead frame, and wherein the conductive elements are fingers of the lead frame.

8. The microelectronic package of claim 1, wherein the substrate includes an element having a coefficient of thermal expansion of less than 8 parts per million per degree Celsius.

9. The microelectronic package of claim 8, wherein the conductive elements extend along a surface of the substrate facing away from the microelectronic element.

10. The microelectronic package of claim 1, wherein the sloping surface extends between the front face of the microelectronic element and the edge surface of the substrate.

11. The microelectronic package of claim 1, wherein at least a portion of the edge surface is not covered by the dielectric material.

12. The microelectronic package of claim 1, wherein the dielectric material covers the entire edge surface of the substrate.

13. The microelectronic package of claim 12, wherein the dielectric material covers at least a portion of the second surface of the substrate.

14. A system comprising a structure according to claim 1 and one or more other electronic components electrically connected to the structure.

15. A system as claimed in claim 14 further comprising a housing, said structure and said other electronic components being mounted to said housing.

16. A method of making a microelectronic package comprising:
    providing a substrate having first and second opposed surfaces and an edge surface extending therebetween, the substrate having a plurality of terminals and a plurality of conductive elements electrically connected with the terminals;
    mounting a microelectronic element to the substrate, the microelectronic element having a front face and contacts thereon, such that at least some of the contacts of the microelectronic element are adjacent to the edge surface of the substrate;
    depositing a dielectric material overlying the edge surface of the substrate and defining a sloping surface between the front face of the microelectronic element and the substrate, the dielectric material being other than an adhesive layer between the microelectronic element and the substrate; and
    depositing a conductive matrix material defining respective conductive interconnects extending along the sloping surface, the conductive interconnects electrically interconnecting the contacts with the conductive elements.

17. The method of claim 16, wherein the step of depositing a conductive matrix material includes dispensing the conductive matrix material directly onto the microelectronic package.

18. The method of claim 16, wherein the step of depositing a conductive matrix material includes stenciling the conductive matrix material directly onto the microelectronic package.

19. The method of claim 16, wherein the step of depositing a conductive matrix material includes transfer printing the conductive matrix material directly onto the microelectronic package.

20. The method of claim 16, wherein the step of depositing a dielectric material includes covering the entire edge surface of the substrate.

21. The method of claim 20, wherein the step of depositing a dielectric material includes covering at least a portion of the second surface of the substrate.

22. The method of claim 16, wherein the step of depositing a dielectric material includes covering at least a portion of the second surface of the substrate.

* * * * *